United States Patent [19]
Lauby et al.

[11] Patent Number: 6,043,640
[45] Date of Patent: Mar. 28, 2000

[54] MULTIMETER WITH CURRENT SENSOR

[75] Inventors: William J. Lauby, Mukilteo; Charles A. Bublitz, Snohomish; Charles R. Jensen, Camano Island; Brian S. Aikins, Everett; Steven W. Fisher, Edmonds, all of Wash.

[73] Assignee: Fluke Corporation, Everett, Wash.

[21] Appl. No.: 08/960,410

[22] Filed: Oct. 29, 1997

[51] Int. Cl.⁷ ........................................... G01R 1/00
[52] U.S. Cl. ................. 324/127; 324/117 R; 324/117 H; 336/175
[58] Field of Search ........................ 324/132, 133, 324/117 R, 117 H, 127; 336/175

[56] References Cited

U.S. PATENT DOCUMENTS

| | | | |
|---|---|---|---|
| 1,862,613 | 6/1932 | Tomodo | 336/175 |
| 2,375,591 | 5/1945 | Schweitzer | 336/175 |
| 4,754,218 | 6/1988 | Wagner | 324/127 |
| 4,839,600 | 6/1989 | Kuurstra | 324/127 |
| 5,057,769 | 10/1991 | Edwards | 324/127 |
| 5,124,642 | 6/1992 | Marx | 324/127 |
| 5,349,289 | 9/1994 | Shirai | 324/127 |
| 5,481,185 | 1/1996 | Lane | 324/133 |
| 5,610,512 | 3/1997 | Selcuk | 324/127 |
| 5,684,466 | 11/1997 | Keating | 340/662 |

*Primary Examiner*—Josie Ballato
*Assistant Examiner*—T. R. Sundaram
*Attorney, Agent, or Firm*—George T. Noe

[57] ABSTRACT

A multimeter having an elongated housing with a fixed recess for receiving a current-carrying conductor is provided. The multimeter is adapted to measure various parameters including a.c. and d.c. voltage, resistance, and a.c. current. On one end of the elongated housing of the multimeter is a C-shaped current sensor mounted around the fixed recess for measuring a.c. current in the current-carrying conductor and on the other end is a pair of test leads for measuring resistance, a.c. voltage, and d.c. voltage. The current sensor and the test leads provide input signals to an analog-to-digital converter (ADC) to obtain digital samples which are displayed as measurement results according to the selected measurement mode.

11 Claims, 6 Drawing Sheets

MULTIMETER WITH CURRENT SENSOR

BACKGROUND OF THE INVENTION

This invention relates generally to electronic test instruments and in particular to a multimeter having a current sensor for measuring current and test leads for measuring voltage and resistance.

Multimeters, also called digital multimeters or "DMMs", are adapted for measuring a number of parameters generally needed for service, troubleshooting, and maintenance applications. Such parameters typically include a.c. (alternating current) voltage and current, d.c. (direct current) voltage and current, and resistance or continuity. Other parameters such as frequency, capacitance, temperature may be readily added to meet the requirements of the particular application. In order to measure current with a general purpose multimeter, an internal current shunt having a known resistance must be inserted in the current path, requiring a break in the current-carrying conductor. The voltage drop across the current shunt is then measured to determine the current.

General purpose multimeters employing internal current shunts are generally limited to ten amperes maximum because of the capacity of the multimeter test leads and circuitry to carry the current. Furthermore, the multimeter generally must be protected with an internal fuse to prevent excessive current levels from flowing through the multimeter, both for safety reasons and to prevent damage to the multimeter. The difficulty in removing a blown fuse, coupled with the time and cost necessary to procure a replacement fuse, make it desirable to obtain a non-contact current measuring instrument that requires no internal fuse.

Clamp-on multimeters provide improved capability for measuring current over general purpose multimeters by employing an integral current clamp which senses the current in the current-carrying conductor without having to cut or break the current-carrying conductor. The current clamp is typically provided in the same housing with a multimeter which measures other parameters such as voltage and resistance in the conventional manner using separate test probes. The current clamp is closed around the current-carrying conductor, which may include copper wires and buss bars, to sense the magnetic field created by the current flow. The current clamp provides a voltage signal for measurement by the multimeter which calculates and displays the measured current level. Because there is no current shunted from the current-carrying conductor through the clamp-on multimeter, the constraint on the maximum current that may be measured has largely been eliminated. Likewise, the internal fuse has been eliminated in clamp-on multimeters.

In order to obtain a valid current measurement, the magnetic core in the current clamp must completely encircle the current-carrying conductor so that the current clamp is completely closed. The current clamp must be mechanically actuated to open the jaws, the current-carrying conductor inserted, and the jaws then closed around the current-carrying conductor. In tight physical spaces such as an electrical cabinet, inserting the clamp-on multimeter and using this technique to make a current measurement is inconvenient and difficult. The current clamp is subject to breakage, abuse, and is vulnerable to dirt and contamination since the alignment of the jaws allowing completion of the magnetic core is critical to obtaining a valid measurement. Clamp-on multimeters thus suffer from reliability problems as well as requiring a large physical space in which to actuate the jaws of the current clamp. Furthermore, clamp-on multimeters tend to be physically heavy because of the substantial amount of iron used on the magnetic core.

Ammeters having a C-shaped current sensor with a fixed recess for receiving a current-carrying conductor presently exist for measuring electrical current in conductors. The Universal Clamp Meter ("UCM") Model 200 from Multi of Japan has a C-shaped current sensor on one end of its housing and a current clamp on the other end. The UCM is a hybrid instrument illustrating the desirability of having a C-shaped current sensor to overcome the short-comings of the current clamp discussed above. However, the current clamp, despite its disadvantages, was not eliminated from the UCM. The C-shaped current sensor is not compensated, thus making measurement accuracy relatively poor and highly dependent on the geometry of the current-carrying conductor within the fixed recess. The measurement accuracy of the current clamp, which is not substantially affected by the geometry of the current-carrying conductor, far exceeds that of the C-shaped current sensor as implemented in the UCM, thus restricting the C-shaped current sensor to a more limited role of current detection rather than current measurement while the current clamp is then deployed to obtain more accurate current measurements.

In U.S. Pat. No. 5,057,769, "AC Current Sensor", issued Oct. 15, 1991, to Gerald L. Edwards, and assigned to Sensorlink Corporation, a C-shaped current sensor having compensating coils for substantially increased measurement accuracy is described. The Ampstik Current Measuring Products manufactured by SensorLink Corporation, allow for measuring current flowing through high voltage lines without having to physically encircle the current-carrying conductor. The ammeter consists of the C-shaped current sensor with compensating coils coupled to an electronic measurement circuit mounted in an integral housing. In its intended application, the ammeter is placed on the end of a "hot stick", a non-conducting rod used in the electrical power industry for use with high voltage power lines, in order to make a current measurement.

The ammeter must be physically large in order to accommodate the two and four inch buss bars encountered in the electrical utility applications. At the same time, the Ampstik ammeters are optimized to operate in voltage environments of up to 400,000 Volts and can measure currents of up to 5,000 Amperes. Thus, the Ampstik ammeters are not intended for use as handheld multimeters, do not have the sensitivity to operate at the current levels used in typical service and maintenance applications, and have a substantially larger physical size than the prior art clamp-on multimeters discussed above.

In Co-pending application Ser. No. 08/819,527, "Improved Coil for An AC Current Sensor", filed Mar. 17, 1997, to Charles R. Jensen, and assigned to Fluke Corporation, an improved current sensor having reduced size and increased sensitivity and measurement accuracy is described. The current sensor allows for current measurements to be made without having to physically encircle the current-carrying conductor while being adapted for operation in the lower voltage and current ranges that may be encountered in service and maintenance applications for multimeters. The use of compensation coils provides for accurate measurements which are not substantially affected by the geometry of the current carrying conductor within the fixed recess of the current sensor. Magnetic fields outside of the fixed recess of the coil are rejected to a desired degree to prevent interference from other current-carrying conductors.

Therefore, it would be desirable to provide a handheld multimeter having a single current sensor fixed recess to obtain a substantially reduced size and increased reliability.

SUMMARY OF THE INVENTION

In accordance with the present invention, a multimeter having a current sensor with a fixed recess for receiving a current-carrying conductor is provided. The multimeter is adapted to measure various parameters including a.c. and d.c. voltage, resistance, and a.c. current.

In the preferred embodiment, the multimeter is adapted for electrical testing applications. The resistance function is implemented as a continuity test in which a lower resistance range, for example, less than 10,000 ohms is measured, and a decision is made regarding the presence or absence of a short circuit between the test probes. The voltage function is implemented with one volt resolution and with no voltage ranging, thus providing for quicker voltage readings with adequate resolution for electrical tests which are typically in the 120 to 240 line voltage range. A relatively low input impedance, substantially less than the one megohm of general purpose multimeters, was maintained between the test probes in order to reduce the effects of "ghost voltages" induced into otherwise dead circuits from adjacent live electrical circuits.

On one end of the elongated housing of the multimeter is the C-shaped current sensor placed around the fixed recess for measuring a.c. current and on the other end is a pair of test leads for measuring resistance, a.c. voltage, and d.c. voltage. The current sensor and the test leads provide input signals to an analog-to-digital converter (ADC) to obtain digital samples which are displayed as measurement results according to the selected parameter.

The C-shaped current sensor is placed around the fixed recess in the one end of the elongated housing. Because there are no moving parts that must be mechanically actuated in the C-shaped current sensor, a substantially more compact multimeter size is achieved, along with enhanced reliability and durability. The elongated housing is designed to allow the multimeter to be handheld, with ready access to the user interface consisting of a rotary knob, display, voltage indicator, and display hold button, and to be easily placed in the tool belt or pocket of the user when not in use.

One object of the present invention is to provide a multimeter having a current sensor with a fixed recess for receiving a current-carrying conductor.

Another object of the present invention is to provide a multimeter for measuring voltage, current, and resistance having an integral current sensor with no moving parts.

An additional object of the present invention is to provide a multimeter having an elongated housing with a fixed recess for receiving a current-carrying conductor at one end of the housing and test leads at the other end.

Other features, attainments, and advantages will become apparent to those skilled in the art upon a reading of the following description when taken in conjunction with the accompanying drawings.

DETAILED DESCRIPTION OF THE INVENTION

Figure 1:
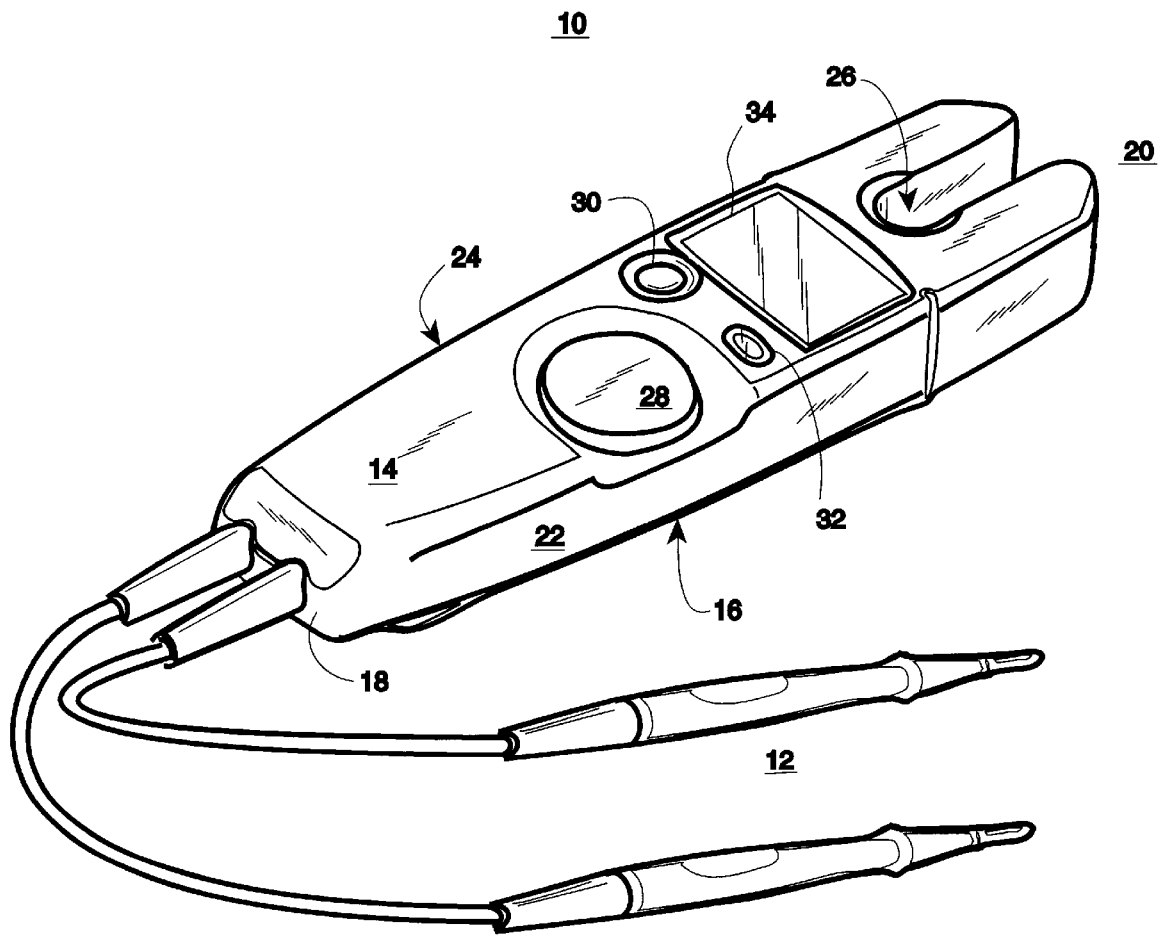
FIG. 1 is a front-bottom-right side perspective view of the multimeter according to the present invention.

In FIG. 1, there is shown a front-bottom-right side perspective view of a multimeter 10 according to the present invention. The multimeter 10 has an elongated housing having a front surface 14, a rear surface 16, a bottom end 18, a top end 20, a right side 22, and a left side 24. A pair of test probes 12 is attached via insulated probe wire to the bottom end 18. The top end 20 has a fixed recess 26 for receiving a current-carrying conductor (not shown). On the top surface 14 are mounted a rotary knob 28, a hold button 30, a voltage indicator 32, and a display 34 which collectively form a user interface of the multimeter 10.

The elongated housing is obtained by making the top and bottom ends 20 and 18 substantially narrower than the left and right sides 22 and 24, allowing for easier handheld operation and access to the user interface of the multimeter 10. The elongated housing is preferably of a size that allows for handheld operation of the multimeter 10 using one hand. The rotary knob 28 and hold button 30 are positioned to allow for actuation by either hand holding the multimeter 10 as well as easy transport in the pocket or tool belt of the user. The rotary knob 28 is used to select the measurement mode of the multimeter 10 which includes a voltage mode, a current mode, and a resistance mode, as well as turning the instrument power off. The hold button 30 operates to retain the present measurement result on the display 34 when pressed. The voltage indicator 32 is a light source that visually indicates the presence of voltage levels across the pair of test probes 12 that may present a shock hazard and which also functions as a quick indicator of the presence or absence of line voltage. In the preferred embodiment of the present invention, the voltage indicator 32 lights when the voltage level across the test probes 12 exceeds 30 volts a.c. or 60 volts d.c., regardless of the measurement mode of the multimeter 10.

In the voltage mode, the multimeter 10 receives a voltage across the test probes 12 and provides a measurement of the voltage on the display 34. Preferably, the multimeter 10 automatically selects between d.c. and a.c. voltage measurements while in the voltage mode based on the frequency content of the voltage in order to minimize the interaction of the user with the rotary knob 28. Alternatively, the rotary knob 28 may be used to manually select between a.c. voltage and d.c. voltage measurement modes.

In the resistance mode, the multimeter 10 provides a measurement of an unknown resistance present between the test probes 12 by injecting a test current through an unknown resistance present between the pair of test probes 12. In the preferred embodiment, a subset of the traditional resistance measurement is performed in the form of a continuity test. The presence or absence of a short circuit between the pair of test probes 12, defined as a resistance of less than a predetermined number of ohms, is a decision made by the multimeter 10 which can be quickly indicated, both numerically on the display 34 and as an audio tone that is turned on or off.

In the current mode, the multimeter 10 provides a measurement of the a.c. current flowing through the current-carrying conductor that has been inserted in the fixed recess 26. The current-carrying conductor generates a magnetic field in proportion to the current. The magnetic field is received by a current sensor (not shown) mounted within the elongated housing of the multimeter 10 and the measurement signal generated by the current sensor is provided to the measurement circuitry of the multimeter 10 which displays the measurement on the display 34. The elongated housing in the area around the current sensor is constructed of a non-magnetic material such as plastic to prevent interference with current measurements. The current sensor employed in the present invention has no moving parts and is contained within the top end 20 of the elongated housing around the fixed recess 26, thus providing for a multimeter 10 with substantially improved durability and reliability over clamp-on multimeters.

The current sensor has no requirement that it encircle the current-carrying conductor in order to measure the current, thus providing for the elongated housing with substantially reduced size. The fixed recess 26 need only be wide enough to accommodate the maximum outside diameter of the current-carrying conductor including any insulation. The outside diameter of the top end 20 of the elongated housing need only be wide enough to accommodate the width of the current sensor inside. In this way, the multimeter 10 according to the present invention provides for obtaining current measurements of current-carrying conductors located in tight physical spaces not reachable by prior-art clamp meters.

Figure 2:
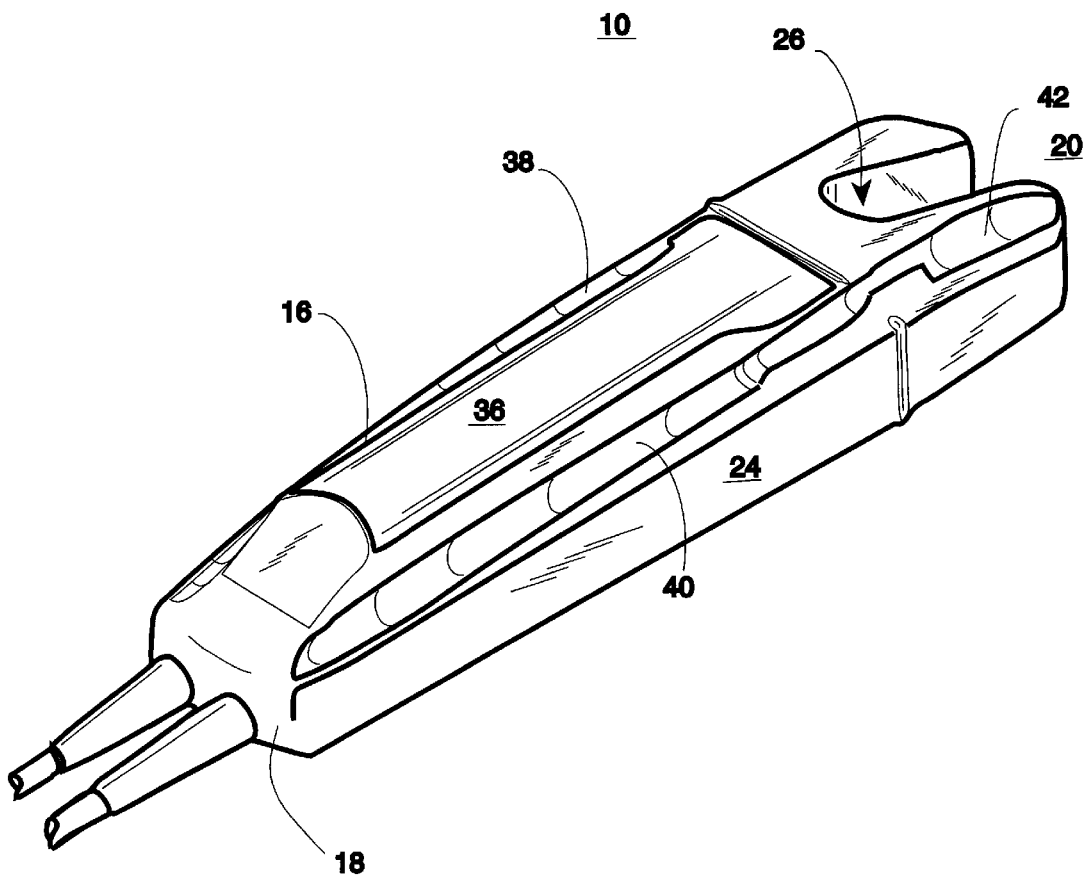
FIG. 2 is a rear-bottom-left side perspective view of the multimeter of FIG. 1.

In FIG. 2 there is shown a rear-bottom-left side perspective view of the multimeter 10. The rear surface 16 is shown facing up. The rear surface 16 includes a convex area 36 which is a battery compartment in the preferred embodiment. Along each side of the convex area 36 are channels 38 and 40 that are adapted to securely receive each of the pair of test probes 12 and retain them for storage when the multimeter 10 is not in use or when current measurements are being made. The channel 40 is extended to the top end 20 as a forward channel 42 that is adapted to securely receive one of the pair of test probes 12 in a forward position such that the probe extends out from the top end 20 of the multimeter 10 to allow for easier probing with the pair of test probes 12.

Figure 3:
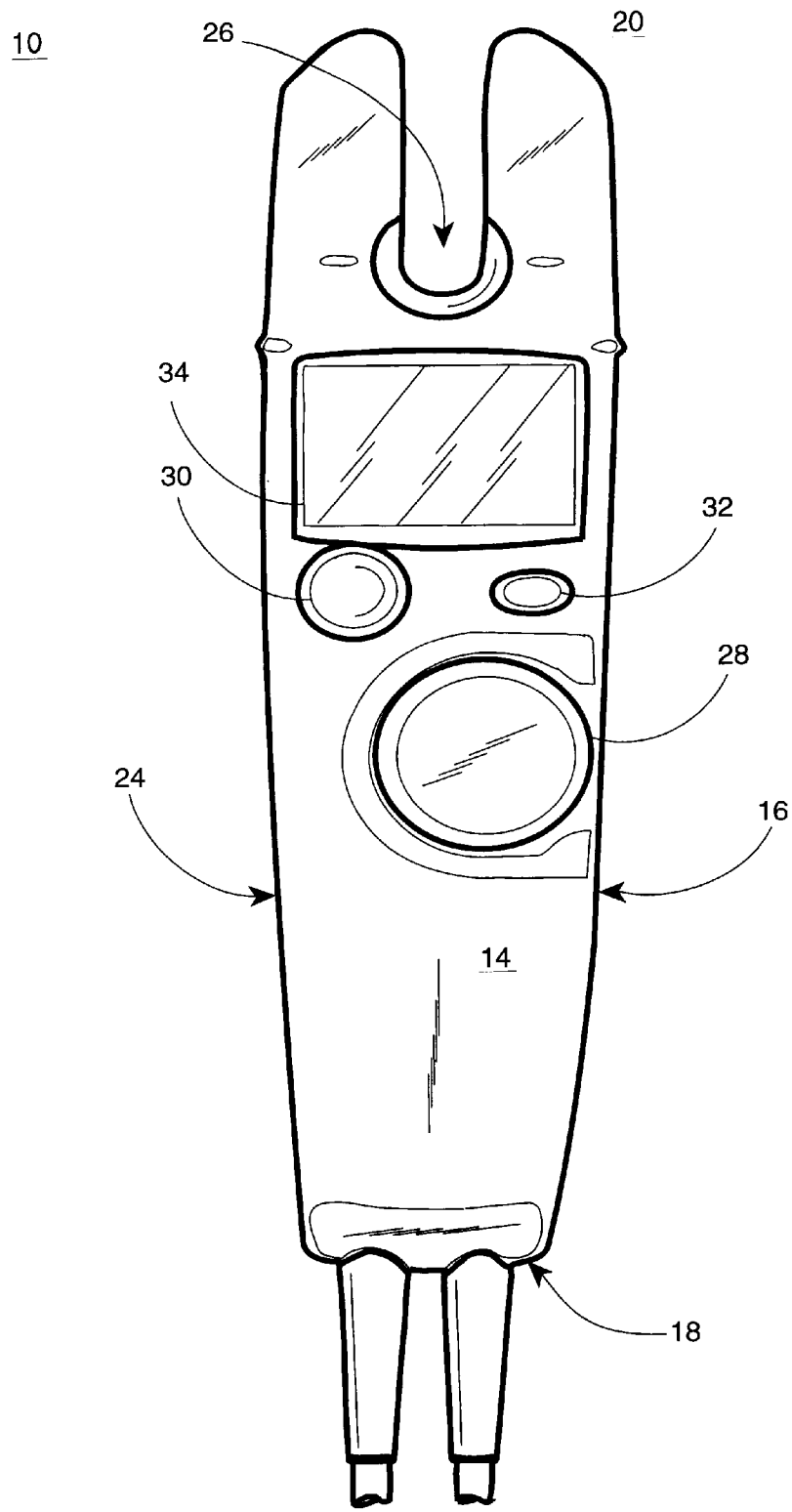
FIG. 3 is a top plan view of the multimeter of FIG. 1.

In FIG. 3, there is shown a top plan view of the multimeter 10. The top end 20 and bottom end 18 are substantially more narrow than the left side 24 and right side 16. The circumference around the elongated body in the area of the rotary knob 28 is chosen to allow the multimeter 10 to be easily held in one hand or inserted into a pouch or pocket of the user. The right side 16 and left side 24 are curved inward toward the bottom end 18 to facilitate easier holding while operating the user interface. The fixed recess 26 for receiving the current-carrying conductor is kept a minimum distance from the user interface to maintain a safe separation for the user of the multimeter 10 from potentially hazardous voltages present in the current-carrying conductor.

Figure 4:
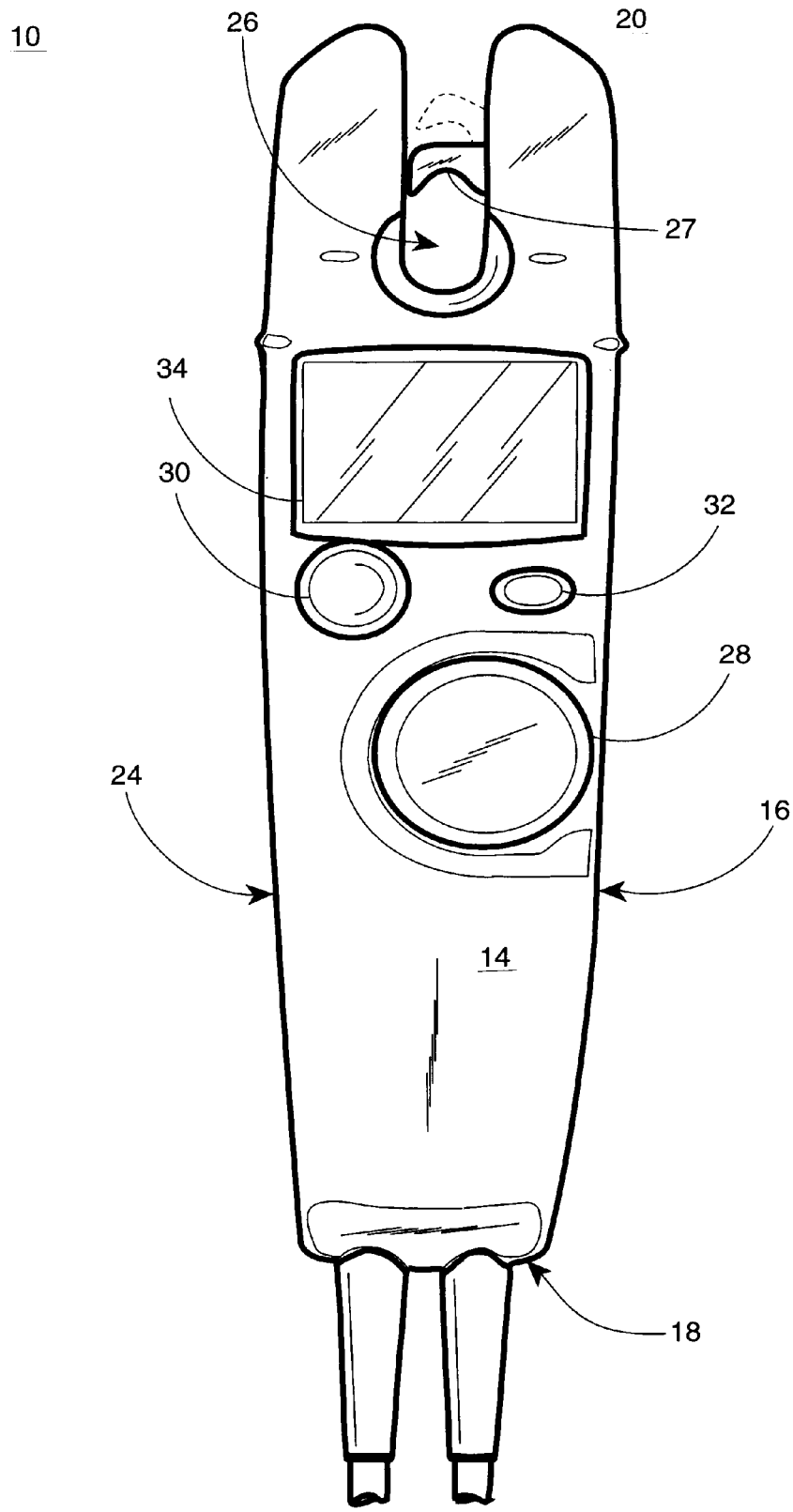
FIG. 4 is a top plan view of the an alternative embodiment of the multimeter of FIG. 1 which includes a hanger hook.

In FIG. 4, there is shown a top plan view of an alternative embodiment of the multimeter 10 which includes a retractable hanger hook 27 shown in an extended position. The retracted hanger hook 27 in the extended position in combination with the fixed recess 26 forms an aperture in the elongated housing. The retractable hanger hook 27, while not necessary for making current measurements, allows for the multimeter 10 to be attached to and hang from fixed objects which may include a current-carrying conductor, other wires, or a hook. In a retracted position, the retractable hanger hook 27 is cantilevered back within the elongated housing, so that the fixed recess 26 is not blocked. The retractable hanger hook 27 is preferably constructed of non-magnetic, non-conducting material to avoid interference with the current sensor and prevent the introduction of an unwanted current path in any electrical circuit being tested. The retractable hanger hook 27 is mechanically actuated between the retracted position and the extended position via a lever (not shown) mounted in the elongated housing.

Figure 5:
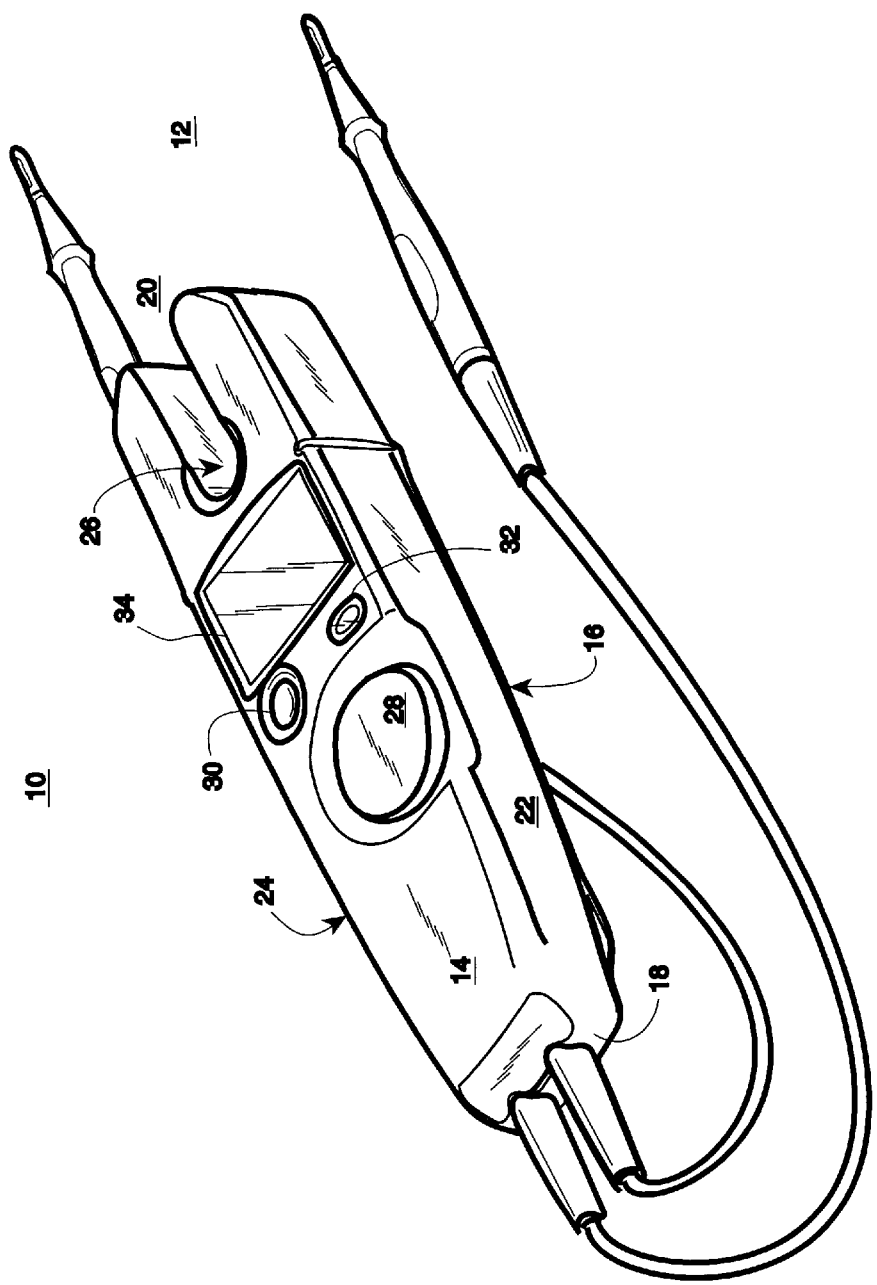
FIG. 5 is a front-bottom-right side perspective view of the multimeter of FIG. 1 with a test probe installed in the forward channel.

In FIG. 5, there is shown the front-bottom-right side perspective view of a multimeter 10 with one of the pair of test probes 12 inserted into the forward channel 42 to extend out from the top end of the multimeter 10. The forward channel 42 holds the test probe securely in position orthogonally away from the top end 20 of the multimeter 10, in line with the elongated body. In this way, voltages and resistances may be probed using one hand to hold the multimeter 10 in combination with one of the pair of test probes 12 and the other hand to hold the other of the pair of test probes 12 during probing operations.

Figure 6:
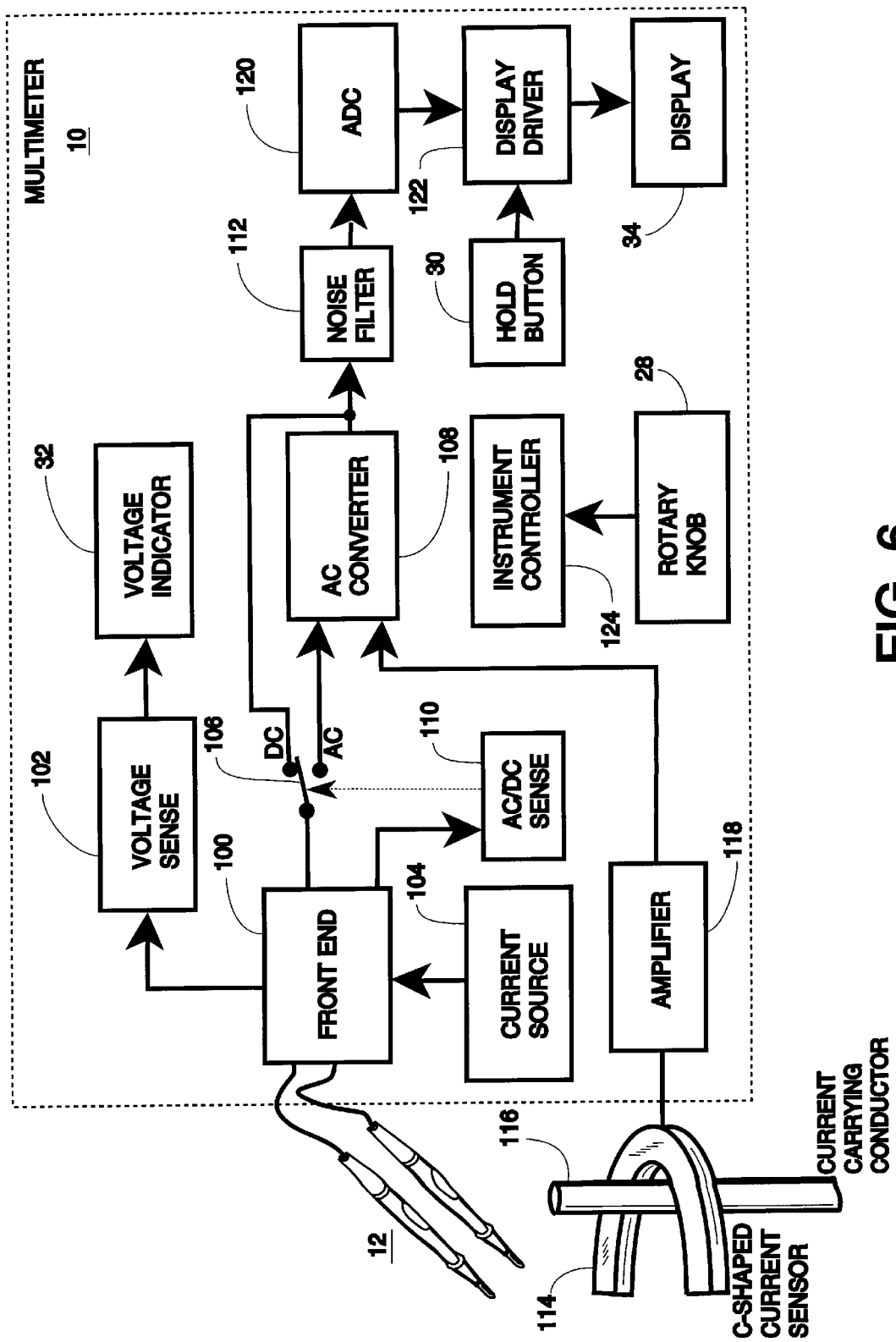
FIG. 6 is a simplified schematic block diagram of the multimeter according to the present invention.

In FIG. 6, there is shown a simplified schematic block diagram of the measurement circuitry of the multimeter 10 according to the present invention. The pair of test probes 12 are coupled to a front end 100 which may contain amplifiers, dividers, voltage protection circuitry, and low pass filters which produces a conditioned input signal. The front end 100 is typically controlled remotely and is set according the type of input voltage, d.c. or a.c., as well as the amplitude of the input voltage which determines the scale factor needed.

A voltage sense circuit 102 coupled to the front end 100 senses the amplitude of the voltage across the pair of test probes 12 and compares this amplitude to threshold values which are chosen according to industry standards for maximum safe voltage levels, both for a.c. and d.c. voltage. In the preferred embodiment, the threshold values were chosen to be 30 V a.c. and 60 V d.c. If the voltage across the pair of test probes 12 exceeds either of the threshold values, the voltage sense circuit 102 provides a signal to the voltage indicator 32 (shown in FIG. 1) mounted on the top surface 14 to provide a visual indication of the presence of hazardous input voltage levels.

In the resistance mode, a current source 104 provides a test current to the front end 100 which couples the current through the pair of test probes 12 and an unknown resistance Rx coupled between the pair of test probes 12. The voltage drop across the unknown resistance Rx may then be measured and the resistance determined according to the equation:

$$Rx = \text{Voltage Drop/Test Current}$$

The resistance mode may also include a continuity test in which resistances between the pair of test probes 12 less than a threshold resistance value are treated as a short circuit and indicated as such via the user interface, either visually or via an audio tone.

The front end 100 provides a conditioned input voltage to a switch 106 which switches between a d.c. path and an a.c. path, depending on the type of signal being measuring. In the a.c. path, an a.c. converter 108 converts an a.c. signal to a measurement signal of primarily d.c. suitable for conversion to digital measurement values. The a.c. converter 108 comprises an averaging circuit but a true r.m.s. (root mean square) converter may be substituted for more accurate a.c. readings according to the requirements of the application. An AC/DC SENSE 110 senses the type of signal being measured to be either primarily a.c. or d.c. in nature and provides a signal to the switch 106 which switches between the a.c. and d.c. paths responsive to the signal type.

A noise filter 112 receives a measurement signal, either directly from the front end 100 via the d.c. path or via the a.c.

converter 108 in the a.c. path, and provides filtering to reject unwanted noise from the measurement signal. The noise filter 112 is implemented as a low pass filter which has characteristics chosen to sufficiently reject unwanted noise including 50/60 hertz line noise.

A C-shaped current sensor 114 detects the a.c. current flowing through a current-carrying conductor 116 placed within its interior which coincides with the fixed recess 26. The C-shaped current sensor 114 is preferably constructed with compensation coils to obtain the desired level of measurement accuracy and to minimize the effects of variations in geometry of the current-carrying conductor 116 within the fixed recess 26. The current signal produced by the C-shaped current sensor 114 is coupled to an amplifier 118 which has calibration adjustments such as offset and gain in order to obtain a properly calibrated signal at an output which is provided to the a.c. converter 108. The a.c. converter 108 selectably receives and converts one of the current signal from the C-shaped current sensor 114 and the conditioned input signal from the front end 100 to produce the measurement signal responsive to the measurement mode that has been selected.

The filtered measurement signal at an output of the noise filter 112 is provided to an analog to digital converter (ADC) 120 which produces digital measurement values at a selected resolution and sample rate. The digital measurement values are provided to a display driver 122 which handles the formatting and converting of the digital measurements according to the selected measurement mode to a format needed by the display 34 (shown in FIG. 1). In the voltage mode, the display 34 preferably indicates that a d.c. or an a.c. voltage is being displayed responsive to the signal generated by the AC/DC SENSE 110. A particular measurement value may be held for continuous display by pressing the hold button 30.

The rotary knob 28 (shown in FIG. 1) selects the measurement mode of the multimeter 10, which includes voltage mode, current mode, or resistance mode, as well as turning the multimeter 10 on and off, according to various detents and labeling (not shown) on the front surface 14. The output of the rotary knob 28 is provided to an instrument controller 124 which controls all of the functions of the multimeter 10. The instrument controller 124 is implemented as a state machine using combinatorial logic in the preferred embodiment in order to obtain reduced component count and lower manufacturing cost. Alternatively, the instrument controller 124 can be readily implemented using a microprocessor which executes a software program to provide control of the measurement processes of the multimeter 10.

It will be obvious to those having ordinary skill in the art that many changes may be made in the details of the above described preferred embodiments of the invention without departing from the spirit of the invention in its broader aspects. For example, a variety of user interface options may be selected from the many that are commercially available, including for example the use of audio tones or synthetic speech to communicate measurement results, along with slide switches and graphical touch screens to accept user input. A multimeter housing employing any of a variety of ergonomic shapes for handheld operation which employ the fixed recess 26 for measuring current may be readily substituted. The fixed recess 26 may be rotated toward the right side 22 or left side 24 or slightly inverted to allow the multimeter 10 to hang from current-carrying conductor 116 or other fixed object. The pair of test leads 12 may be provided with banana plugs which mate with banana jacks in the elongated housing to allow for easy detachment and re-attachment. The multimeter 10 may be readily adapted to contain a C-shaped current sensor for measuring d.c. current as well as a.c. current. Therefore, the scope of the present invention should be determined by the following claims.

What we claim as our invention is:

1. A multimeter, comprising:
   (a) an elongated housing having front and rear surfaces, left and right sides, and top and bottom ends, wherein said top and bottom ends are substantially narrower than said left and right sides, and said top end having a fixed recess for receiving a current-carrying conductor;
   (c) a C-shaped current sensor mounted within said top end and extending around said fixed recess for sensing current in said current-carrying conductor;
   (d) a pair of test probes attached to said bottom end;
   (e) measurement circuitry coupled to said current sensor and said pair of test probes for providing measurements according to a measurement mode; and
   (f) a display coupled to said measurement circuitry for displaying said measurements according to said measurement mode.

2. A multimeter according to claim 1, said rear surface comprising first and second channels for securely receiving said pair of test probes for storage.

3. A multimeter according to claim 2, said rear surface further comprising a forward channel for securely receiving one of said pair of test probes in a forward position wherein said one of said pair of test probes extends out from said top end.

4. A multimeter according to claim 1 further comprising a voltage indicator coupled to said pair of test probes wherein said voltage indicator indicates the presence of hazardous voltages across said pair of test probes.

5. A multimeter according to claim 1 further comprising a rotary knob for selecting said measurement mode.

6. A multimeter according to claim 1, said measurement mode comprising one of a current mode, a voltage mode, and a resistance mode.

7. A multimeter according to claim 1 further comprising a retractable hanger hook mounted in said top end, said retractable hanger hook having an extended position and a retracted position.

8. A multimeter according to claim 7 wherein said retractable hanger hook and said fixed recess form an aperture in said top end when said retractable hanger hook is in said extended position.

9. A muitimeter comprising:
   (a) test leads for receiving an input voltage;
   (b) a front end coupled to said test leads to produce a conditioned input voltage;
   (c) a C-shaped current sensor for magnetically coupling to a current carrying conductor to produce a current signal;
   (d) an AC converter coupled to said front end and to said C-shaped current sensor to selectably receive one of said conditioned input voltage and said current signal according to a measurement mode to produce a measurement voltage;
   (e) an analog to digital converter coupled to said AC converter to produce digital measurement values; and
   (f) a display coupled to said analog to digital converter to display said digital measurement values according to said measurement mode.

10. A multimeter according to claim 9 further comprising:

(a) a voltage sense coupled to said front end to produce a signal when said input voltage is at hazardous levels; and
(b) a voltage indicator coupled to said voltage sense to visually display said signal.

11. A multimeter according to claim 9, said measurement mode comprising one of a voltage mode, a current mode, and a resistance mode.

* * * * *